United States Patent
Embleton et al.

(10) Patent No.: US 10,980,159 B2
(45) Date of Patent: Apr. 13, 2021

(54) SYSTEM AND METHOD FOR MANAGING MULTIPLE CONNECTIONS

(71) Applicant: Dell Products L.P., Hopkinton, MA (US)

(72) Inventors: Steven Embleton, Round Rock, TX (US); Ben John Sy, Austin, TX (US); Eric Michael Tunks, Austin, TX (US); Chadwick Thomas Berry, Austin, TX (US)

(73) Assignee: Dell Products L.P., Hopkinton, MA (US)

( * ) Notice: Subject to any disclaimer, the term of this patent is extended or adjusted under 35 U.S.C. 154(b) by 65 days.

(21) Appl. No.: 16/516,532

(22) Filed: Jul. 19, 2019

(65) Prior Publication Data
US 2021/0022277 A1 Jan. 21, 2021

(51) Int. Cl.
*G06F 1/16* (2006.01)
*H05K 5/00* (2006.01)
*H05K 7/00* (2006.01)
*H05K 9/00* (2006.01)
*H05K 7/18* (2006.01)
*H05K 7/14* (2006.01)

(52) U.S. Cl.
CPC ......... *H05K 9/0088* (2013.01); *H05K 7/1489* (2013.01); *H05K 7/18* (2013.01); *H05K 9/0007* (2013.01); *H05K 9/0062* (2013.01)

(58) Field of Classification Search
CPC .. H05K 9/0009; H05K 9/0018; H05K 9/0007; H05K 9/0062; H05K 9/0088; H05K 7/1489; H05K 7/18; G06F 1/1656; H04B 15/02
See application file for complete search history.

(56) References Cited

U.S. PATENT DOCUMENTS

| | | | |
|---|---|---|---|
| 4,785,136 A | 11/1988 | Mollet et al. | |
| 4,858,309 A | 8/1989 | Korsunsky et al. | |
| 4,871,220 A | 10/1989 | Kohin | |
| 5,049,701 A | 9/1991 | Vowles et al. | |
| 5,084,802 A * | 1/1992 | Nguyenngoc | H05K 9/0062 174/368 |
| 5,250,752 A | 10/1993 | Cutright | |
| 5,294,748 A | 3/1994 | Schwenk et al. | |
| 5,323,298 A | 6/1994 | Shatas et al. | |
| 5,437,560 A | 8/1995 | Mizuguchi | |

(Continued)

OTHER PUBLICATIONS

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf.

(Continued)

*Primary Examiner* — Anthony M Haughton
(74) *Attorney, Agent, or Firm* — Chamberlain, Hrdlicka, White, Williams & Aughtry

(57) ABSTRACT

A data processing device includes an internal volume that is electromagnetic interference (EMI) isolated and a communication system, disposed in the internal volume, that: determines a first EMI state of at least one device of devices disposed in the internal volume; makes a determination that the first EMI state is an EMI emitting state; and disables communications by the communication system using a high-speed connection while allowing the communications using a low-speed connection.

20 Claims, 13 Drawing Sheets

(56) References Cited

U.S. PATENT DOCUMENTS

| | | | |
|---|---|---|---|
| 5,545,844 A | 8/1996 | Plummer, III et al. |
| 5,545,845 A | 8/1996 | Flores |
| 5,649,831 A | 7/1997 | Townsend |
| 5,762,513 A | 6/1998 | Stine |
| 5,812,370 A | 9/1998 | Moore et al. |
| 5,943,218 A | 8/1999 | Liu |
| 6,038,130 A | 3/2000 | Boeck et al. |
| 6,045,385 A | 4/2000 | Kane |
| 6,068,009 A | 5/2000 | Paes et al. |
| 6,176,727 B1 | 1/2001 | Liu et al. |
| 6,208,514 B1 | 3/2001 | Stark et al. |
| 6,225,554 B1 | 5/2001 | Trehan et al. |
| 6,242,690 B1 | 6/2001 | Glover |
| 6,269,001 B1 | 7/2001 | Matteson et al. |
| 6,331,940 B1 | 12/2001 | Lin |
| 6,332,792 B1 | 12/2001 | Lin et al. |
| 6,370,036 B1 | 4/2002 | Boe |
| 6,377,451 B1 | 4/2002 | Furuya |
| 6,437,987 B1 | 8/2002 | Lin |
| 6,517,369 B1 | 2/2003 | Butterbaugh et al. |
| 6,613,977 B1 | 9/2003 | Fowler |
| 6,695,630 B1 | 2/2004 | Ku |
| 6,947,290 B2 | 9/2005 | Hirata |
| 7,035,087 B2 | 4/2006 | Tan |
| 7,075,796 B1 | 7/2006 | Pritchett |
| 7,133,296 B2 | 11/2006 | Choi et al. |
| 7,287,996 B1 | 10/2007 | Shing |
| 7,371,097 B1 | 5/2008 | Pennypacker et al. |
| 7,371,977 B1 | 5/2008 | Preonas |
| 7,692,934 B2 | 4/2010 | Bartscher et al. |
| 7,695,313 B2 | 4/2010 | Karim et al. |
| 7,757,847 B2 | 7/2010 | Tang et al. |
| 8,059,414 B2 | 11/2011 | Wei |
| 8,098,492 B2 | 1/2012 | Rosenberg et al. |
| 8,310,834 B2 | 11/2012 | Fürholzer |
| 8,508,956 B2 | 8/2013 | Nicol |
| 8,530,756 B1 | 9/2013 | Winch |
| 8,636,526 B2 | 1/2014 | Funamura et al. |
| 8,642,900 B2 | 2/2014 | Nordling et al. |
| 8,662,295 B2 | 3/2014 | Kubota et al. |
| 8,687,374 B2 | 4/2014 | Watanabe et al. |
| 8,720,682 B2 | 5/2014 | Navon et al. |
| 8,760,859 B2 | 6/2014 | Fuchs et al. |
| 8,969,738 B2 | 3/2015 | Ross |
| 9,019,711 B2 | 4/2015 | Tamura |
| 9,095,045 B2 | 7/2015 | Rojo et al. |
| 9,370,132 B2 | 6/2016 | Coppola |
| 9,497,894 B1 | 11/2016 | Ramsey |
| 9,549,480 B1 * | 1/2017 | Besterman ............ H05K 5/0204 |
| 9,585,270 B2 | 2/2017 | Yang et al. |
| 9,607,660 B2 | 3/2017 | Bennett, II et al. |
| 9,640,910 B1 | 5/2017 | Chien et al. |
| 9,642,290 B2 | 5/2017 | Anderson et al. |
| 9,820,404 B1 | 11/2017 | Wu et al. |
| 9,829,939 B1 | 11/2017 | Lien et al. |
| 9,930,816 B2 | 3/2018 | Winch et al. |
| 10,007,309 B1 | 6/2018 | Imwalle |
| 10,249,984 B1 | 4/2019 | Rask |
| 10,364,031 B2 | 7/2019 | Goupil |
| 10,420,258 B1 | 9/2019 | Rahilly et al. |
| 10,477,740 B2 | 11/2019 | Coppola |
| 10,477,741 B1 | 11/2019 | Bae et al. |
| 10,492,324 B2 | 11/2019 | Miura |
| 10,520,532 B2 | 12/2019 | Lee |
| 10,541,519 B1 | 1/2020 | Wavering |
| 10,542,642 B2 | 1/2020 | Babhadiashar et al. |
| 10,575,443 B2 | 2/2020 | Woodbury, II et al. |
| 10,638,634 B1 | 4/2020 | Elsasser |
| 10,707,636 B2 | 7/2020 | Yamamoto |
| 10,720,722 B2 | 7/2020 | Tsorng et al. |
| 10,734,763 B2 | 8/2020 | M R et al. |
| 2002/0000645 A1 | 1/2002 | Sato et al. |
| 2002/0001181 A1 | 1/2002 | Kondo |
| 2002/0027769 A1 | 3/2002 | Kasahara et al. |
| 2002/0064035 A1 | 5/2002 | Mair et al. |
| 2003/0011988 A1 | 1/2003 | Irmer |
| 2003/0137811 A1 | 7/2003 | Ling et al. |
| 2003/0174474 A1 | 9/2003 | Mair et al. |
| 2005/0247471 A1 | 11/2005 | Archambeault |
| 2006/0025010 A1 | 2/2006 | Spitaels et al. |
| 2007/0105445 A1 | 5/2007 | Manto et al. |
| 2007/0145699 A1 | 6/2007 | Robbins |
| 2007/0147013 A1 | 6/2007 | Robbins |
| 2007/0151779 A1 | 7/2007 | Robbins |
| 2008/0076291 A1 | 3/2008 | Ewing et al. |
| 2009/0021925 A1 * | 1/2009 | Heimann ............ H05K 9/0062 361/818 |
| 2009/0095523 A1 * | 4/2009 | Stevenson ............ H05K 9/0062 174/565 |
| 2010/0117579 A1 | 5/2010 | Culbert |
| 2010/0208433 A1 * | 8/2010 | Heimann ................. H04Q 1/03 361/724 |
| 2010/0270299 A1 | 10/2010 | Baltussen |
| 2010/0285636 A1 | 11/2010 | Chen |
| 2010/0319981 A1 | 12/2010 | Kapusta et al. |
| 2011/0232956 A1 | 9/2011 | Ramsey |
| 2012/0011700 A1 | 1/2012 | Kelaher et al. |
| 2012/0044653 A1 | 2/2012 | Morris et al. |
| 2012/0116590 A1 | 5/2012 | Florez-Iarrahondo |
| 2012/0178364 A1 | 7/2012 | Dobyns |
| 2012/0285738 A1 | 11/2012 | Cochrane et al. |
| 2013/0160563 A1 | 6/2013 | Dingler et al. |
| 2013/0194772 A1 * | 8/2013 | Rojo ...................... H04Q 1/116 361/818 |
| 2013/0258582 A1 | 10/2013 | Shelnutt |
| 2013/0277520 A1 | 10/2013 | Funk et al. |
| 2014/0138388 A1 | 5/2014 | Synnestvedt |
| 2014/0368821 A1 | 12/2014 | Gazaway et al. |
| 2015/0014912 A1 | 1/2015 | Ivey et al. |
| 2015/0245529 A1 | 8/2015 | Tam et al. |
| 2015/0257310 A1 | 9/2015 | Desouza |
| 2015/0271959 A1 | 9/2015 | Chen et al. |
| 2015/0368423 A1 | 12/2015 | Yamauchi et al. |
| 2015/0373869 A1 | 12/2015 | Macerini et al. |
| 2016/0081231 A1 | 3/2016 | Berke |
| 2016/0111814 A1 | 4/2016 | Hirano et al. |
| 2016/0159480 A1 | 6/2016 | Barth |
| 2016/0182130 A1 | 6/2016 | Ahmed et al. |
| 2016/0372948 A1 | 12/2016 | Kvols |
| 2016/0381818 A1 | 12/2016 | Mills et al. |
| 2018/0062287 A1 | 3/2018 | Shaw et al. |
| 2018/0257334 A1 | 9/2018 | Motoyanagi et al. |
| 2019/0050030 A1 * | 2/2019 | Baum ..................... G06F 1/189 |
| 2019/0056439 A1 | 2/2019 | Lee |
| 2019/0159371 A1 | 5/2019 | Grinsteinner |
| 2019/0230828 A1 * | 7/2019 | Murch ................. H01R 25/162 |
| 2019/0304922 A1 | 10/2019 | Maruthamuthu et al. |
| 2019/0320796 A1 | 10/2019 | Ding |
| 2019/0353356 A1 | 11/2019 | Fischer |
| 2019/0379183 A1 * | 12/2019 | Winsor .................. H05K 9/009 |
| 2020/0187394 A1 * | 6/2020 | Murugesan ............ G06F 30/23 |
| 2020/0187578 A1 | 6/2020 | Sadato |

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

* cited by examiner

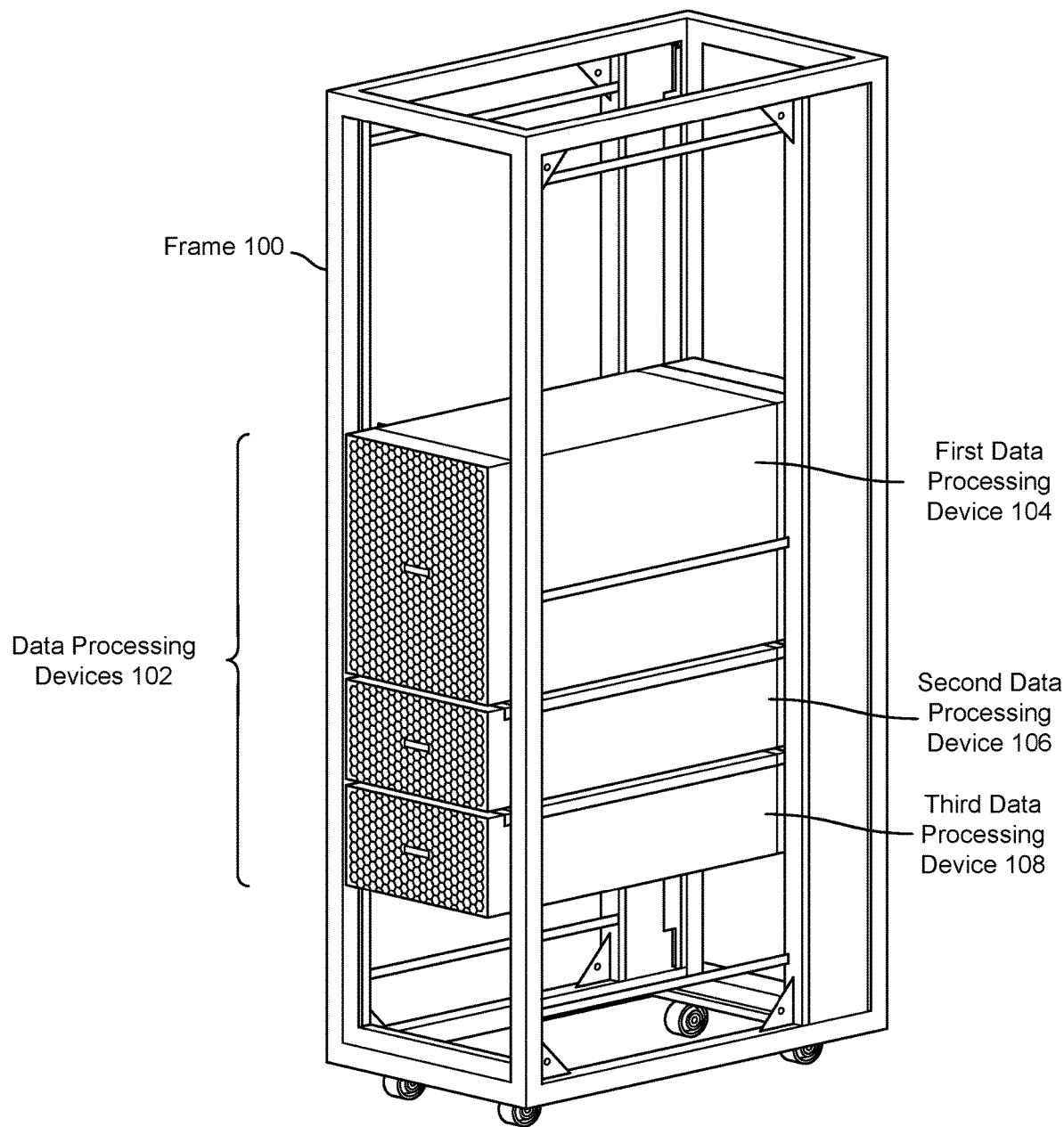
FIG. 1.1

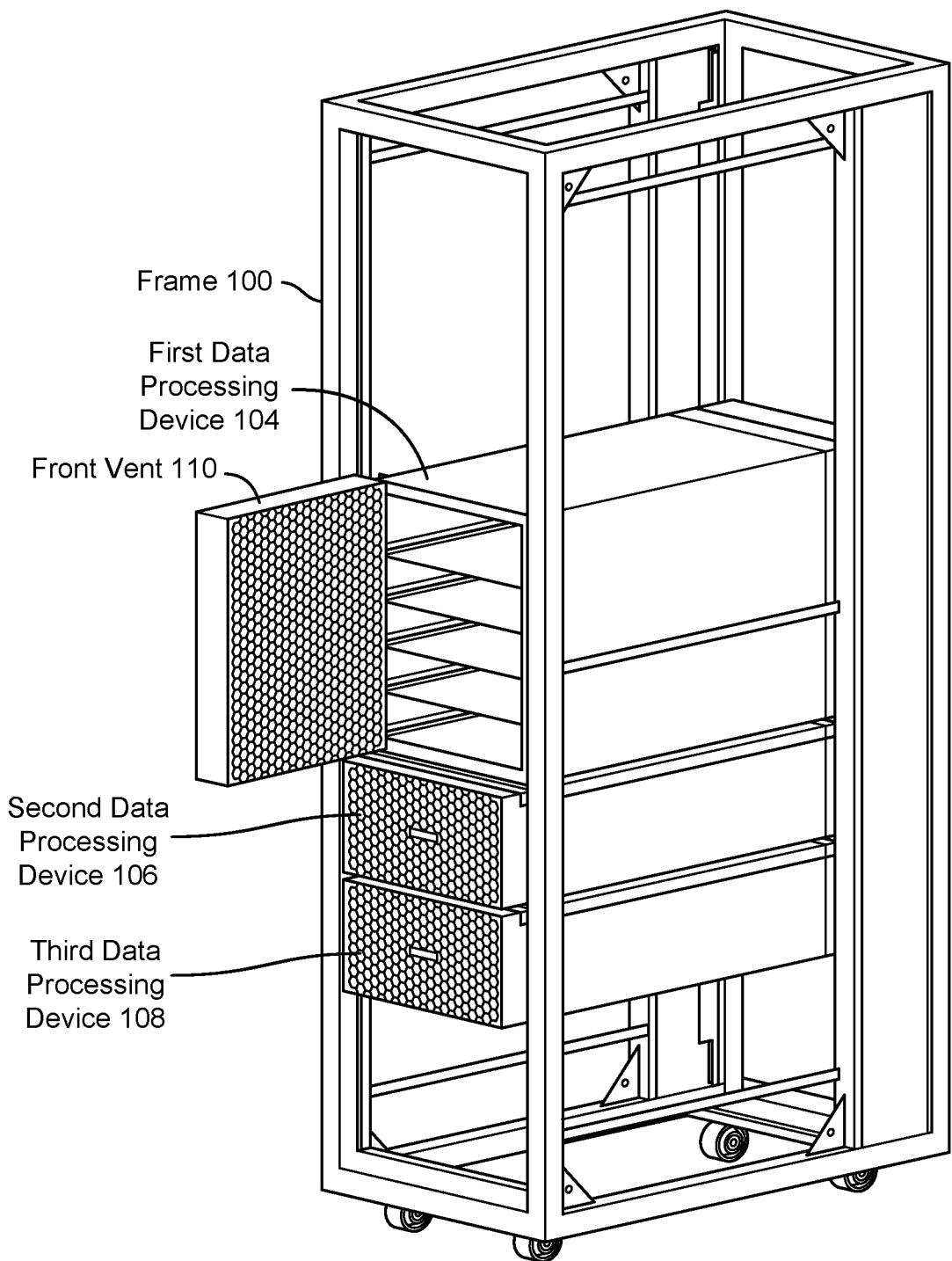
FIG. 1.2

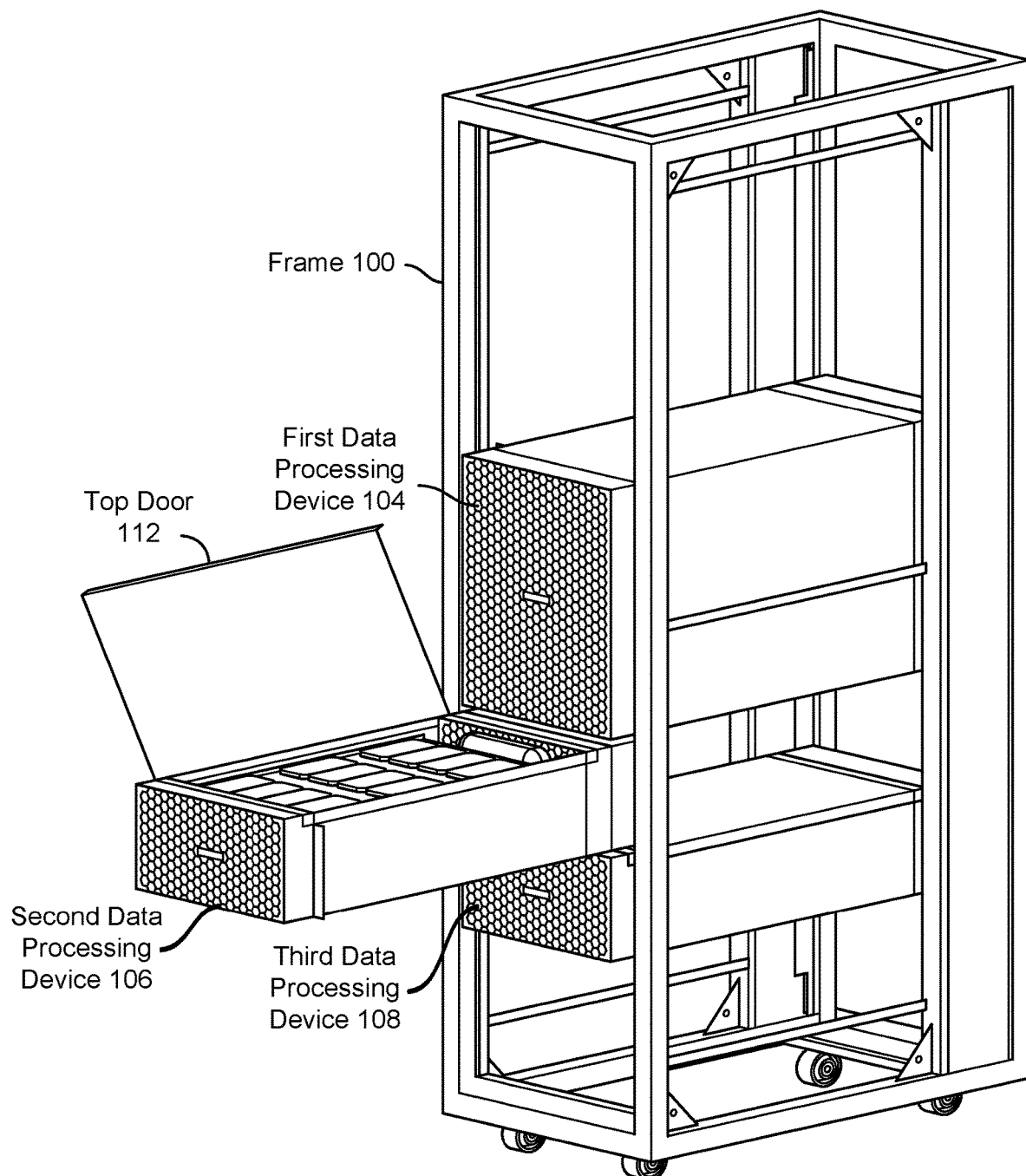
FIG. 1.3

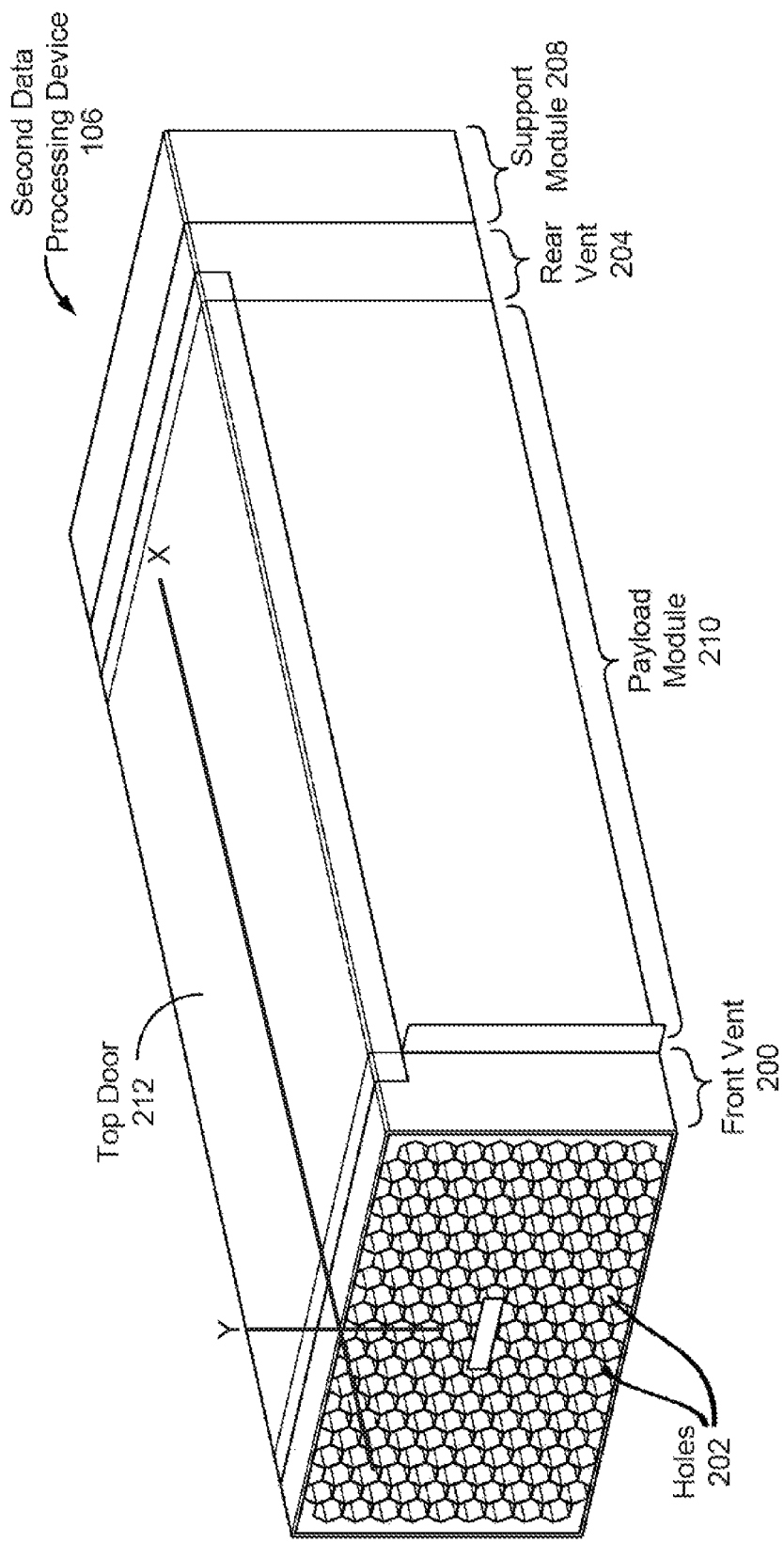
FIG. 2.1

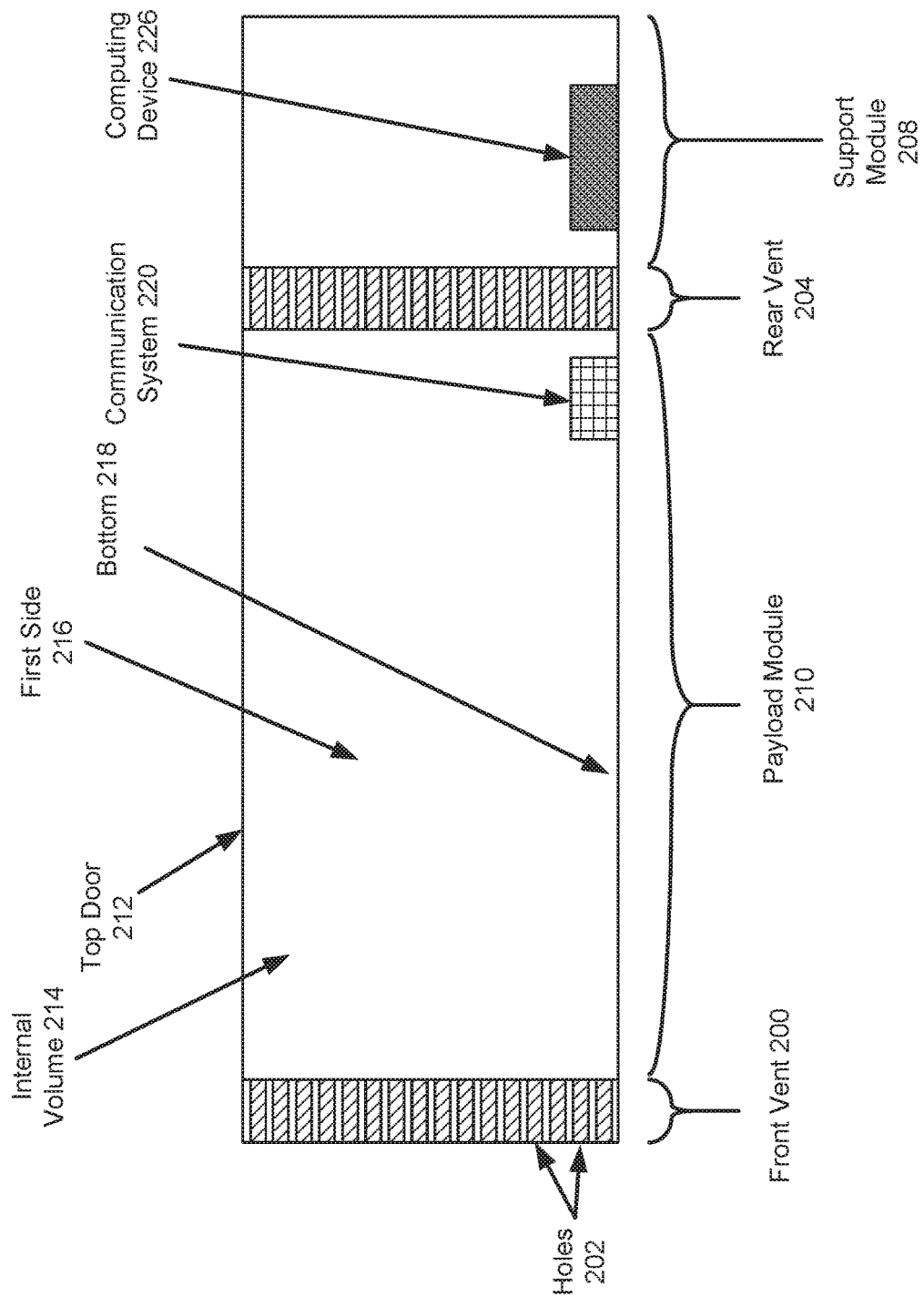
FIG. 2.2

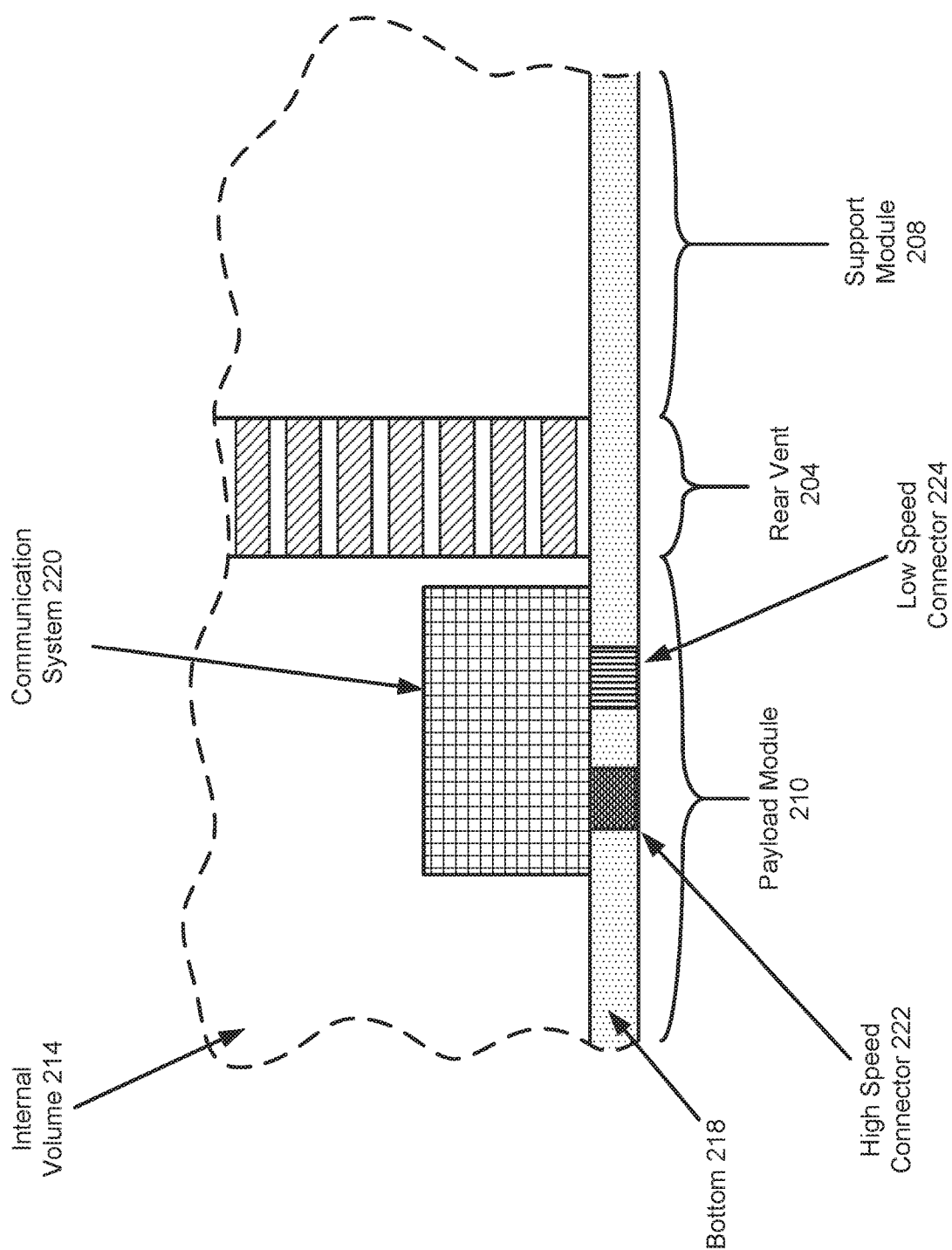
FIG. 2.3

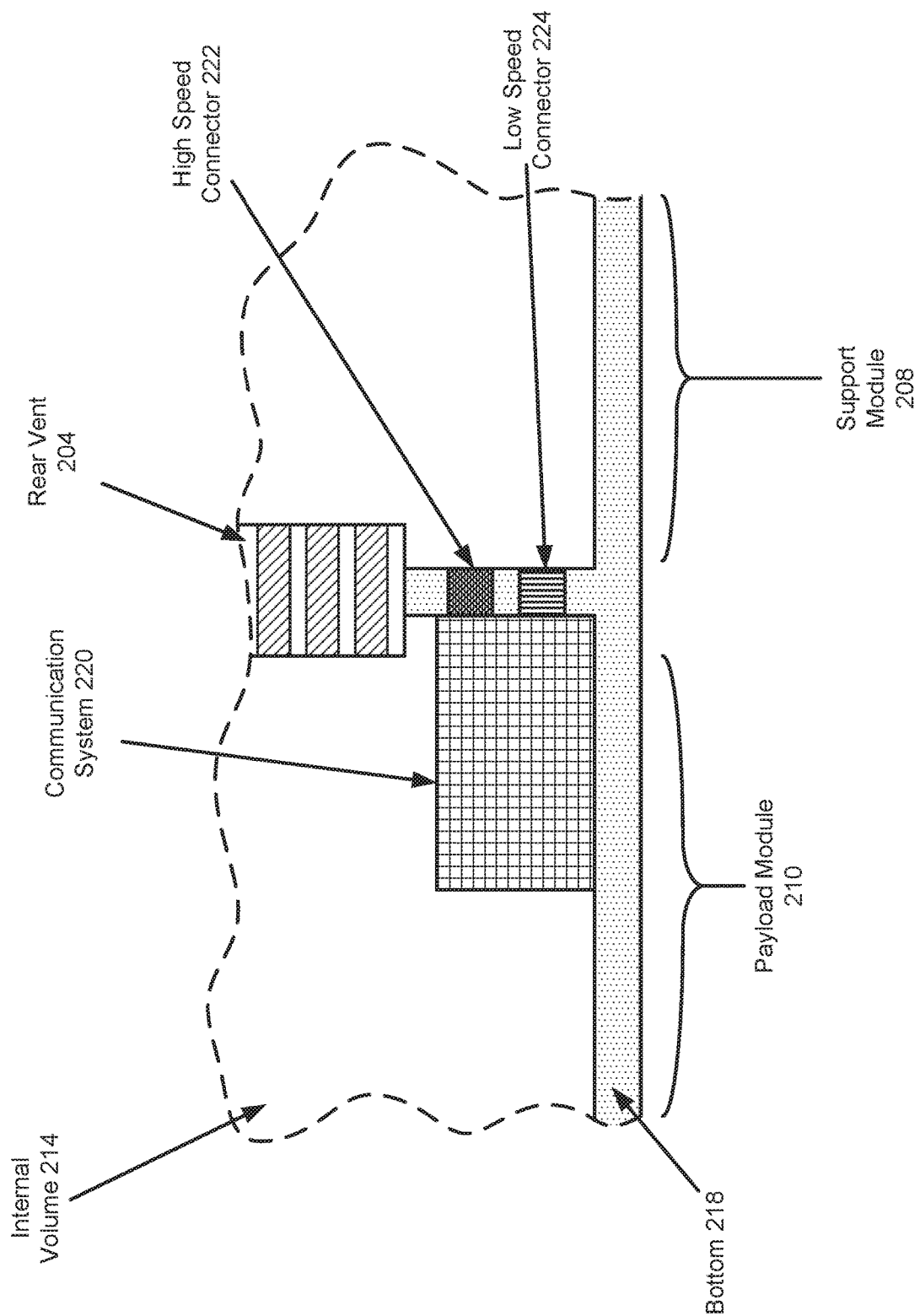
FIG. 2.4

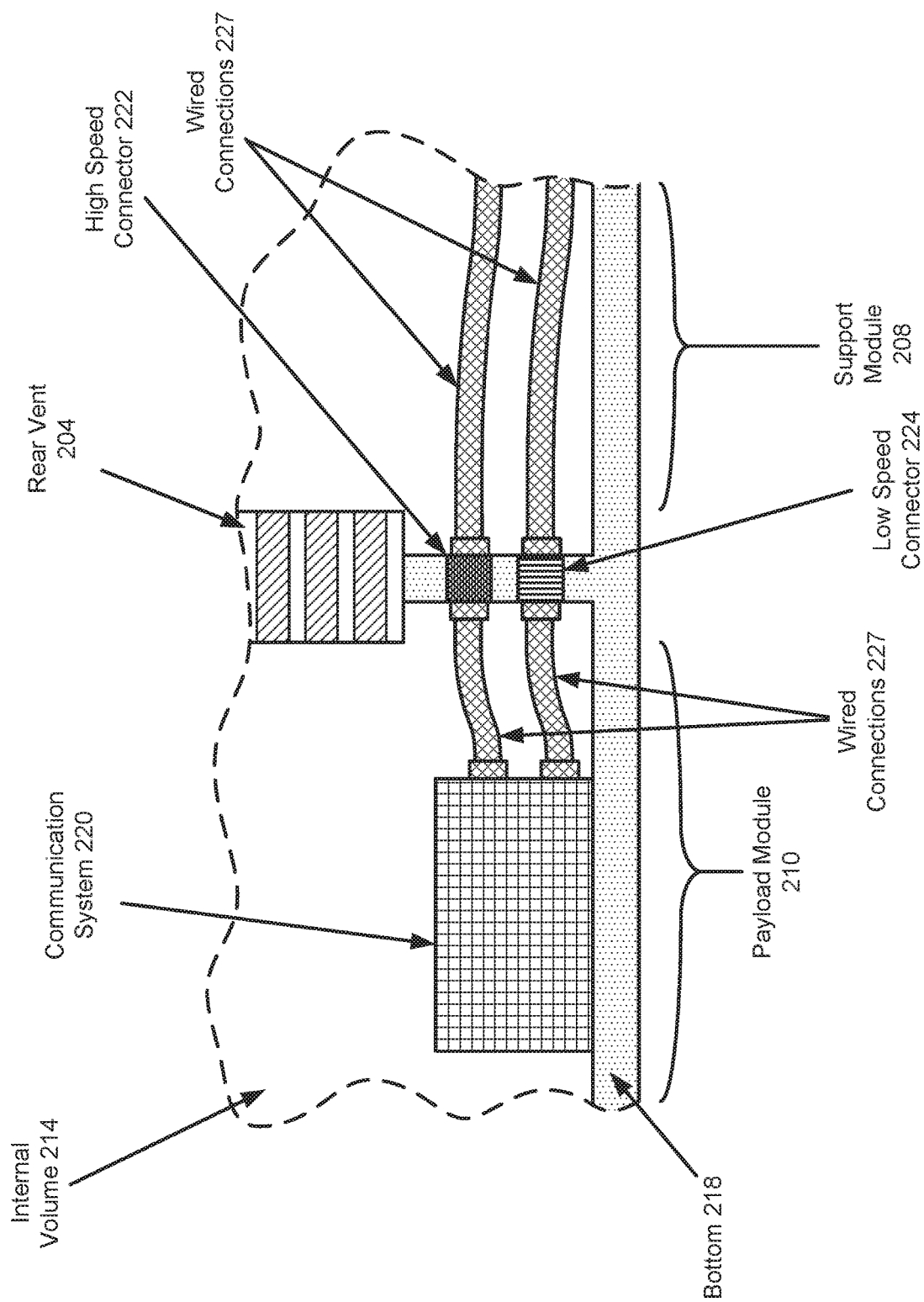
FIG. 2.5

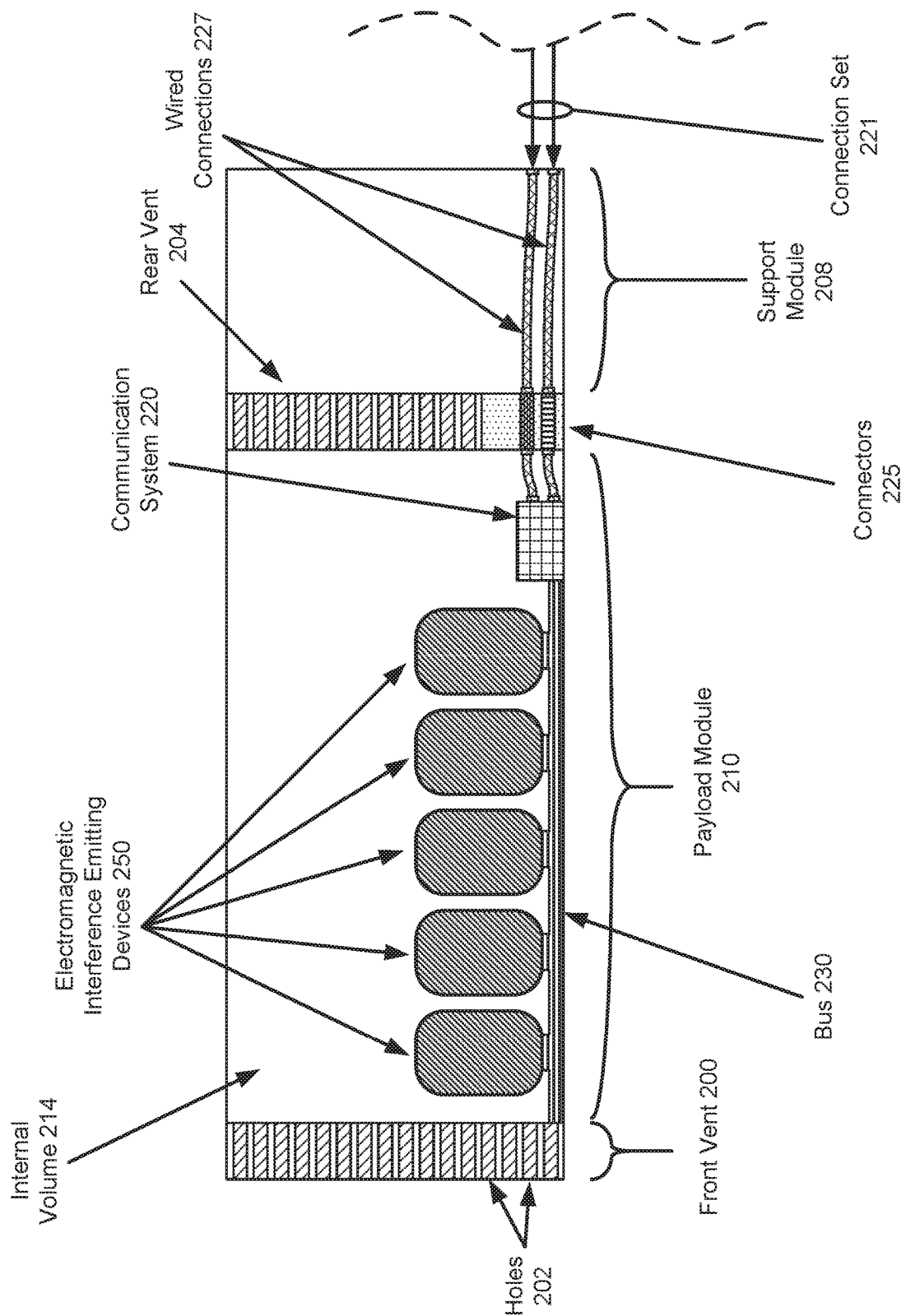
FIG. 2.6

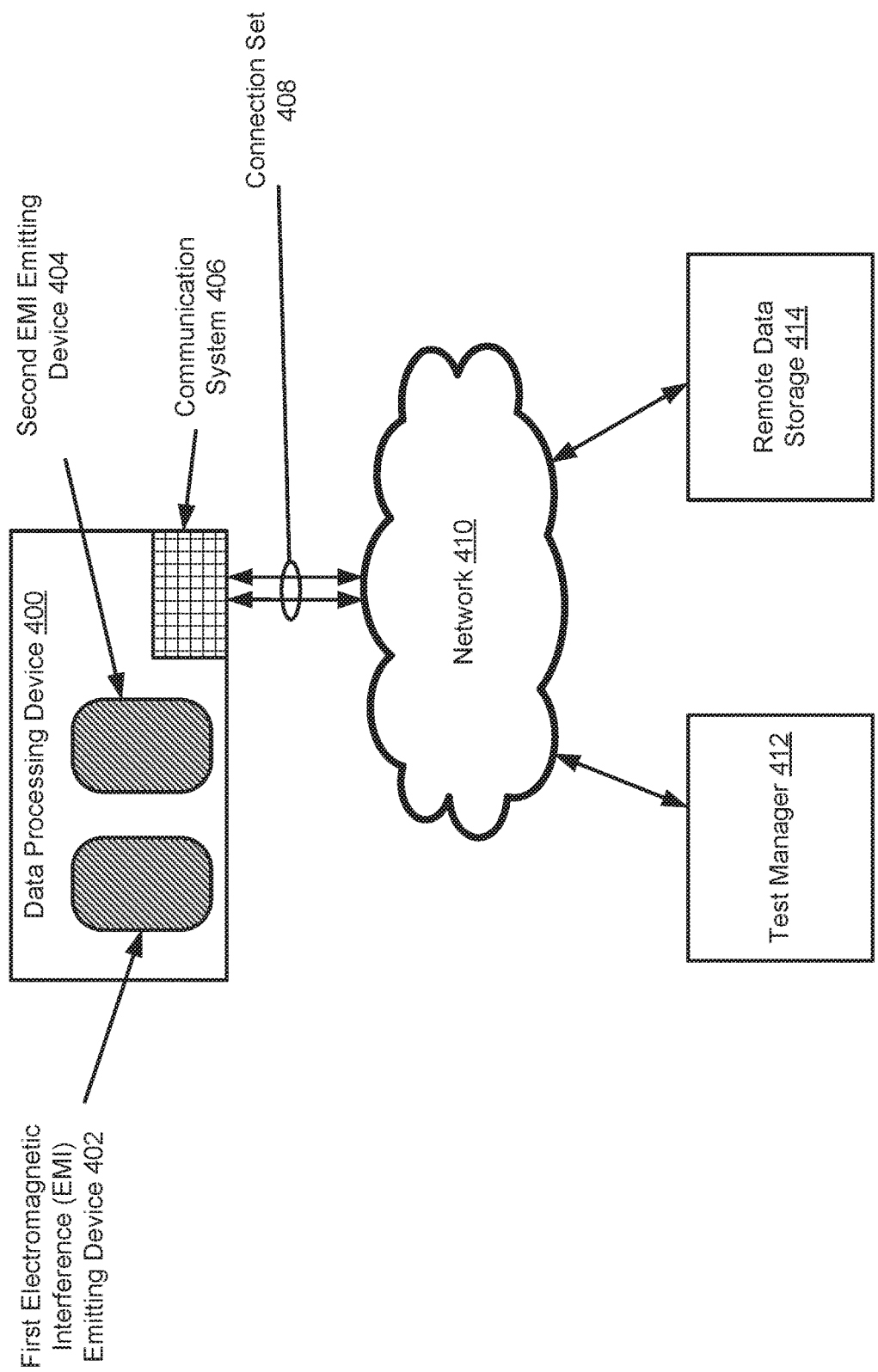
FIG. 4.1

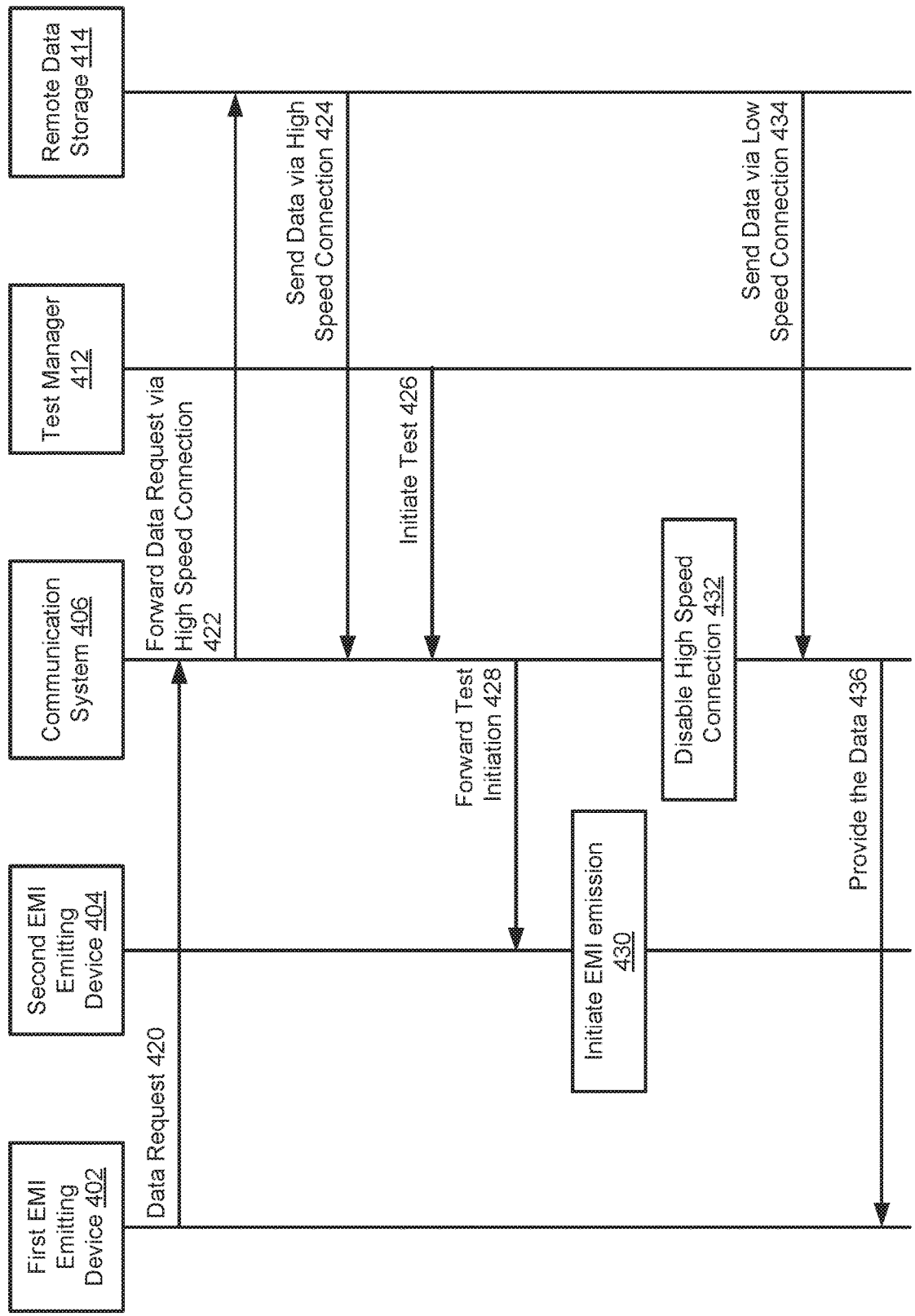
FIG. 4.2

SYSTEM AND METHOD FOR MANAGING MULTIPLE CONNECTIONS

BACKGROUND

High density environment may include devices that are tightly packed together. In other words, the devices may be physically close to each other. Such an environment presents numerous challenges relating to thermal management, mechanical positioning and orienting of devices, and electrical concerns related to power and operation of such devices.

SUMMARY

In one aspect; a data processing device in accordance with one or more embodiments of the invention includes an internal volume that is electromagnetic interference (EMI) isolated; and a communication system, disposed in the internal volume, that determines a first EMI state of at least one device of devices disposed in the internal volume; makes a determination that the first EMI state is an EMI emitting state; and disables communications by the communication system using a high-speed connection while allowing the communications using a low-speed connection.

In one aspect, a method for managing electromagnetic interference (EMI) in accordance with one or more embodiments of the invention includes determining a first EMI state of at least one device of devices disposed in an internal volume of a data processing device, the internal volume is adapted to suppress EMI: generated by the at least one device of the devices; making a determination that the first EMI state is an EMI emitting state; and disabling communications with remote entities by a communication system disposed in the internal volume using a high-speed connection while allowing the communications using a low-speed connection.

In one aspect, a non-transitory computer readable medium in accordance with one or more embodiments of the invention includes instructions that when executed by a data processing device cause the data processing device to perform a method for managing electromagnetic interference (EMI), the method includes determining a first EMI state of at least one device of devices disposed in an internal volume of a data processing device, the internal volume is adapted to suppress EMI generated by the at least one device of the devices; making a determination that the first EMI state is an EMI emitting state; and disabling communications with remote entities by a communication system disposed in the internal volume using a high-speed connection while allowing the communications using a low-speed connection.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1I in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cross section diagram of the data processing device of FIG. 2.1.

FIG. 2.3 shows a second cross section diagram of the data processing device of FIG. 2.1 including a communication system positioned near a first wall of an internal volume.

FIG. 2.4 shows a third cross section diagram of the data processing device of FIG. 2.1 including a communication system positioned near a second wall of an internal volume.

FIG. 2.5 shows a fourth cross section diagram of the data processing device of FIG. 2.1 including a communication system and wired connections.

FIG. 2.6 shows a fifth cross section diagram of the data processing device of FIG. 2.1 including a communication system, wired connections, and electromagnetic interference emitting devices.

FIG. 4.1 shows a diagram of an example system.

FIG. 4.2 shows an action diagram of actions performed by the example system of FIG. 4.1.

DETAILED DESCRIPTION

Figure 3:
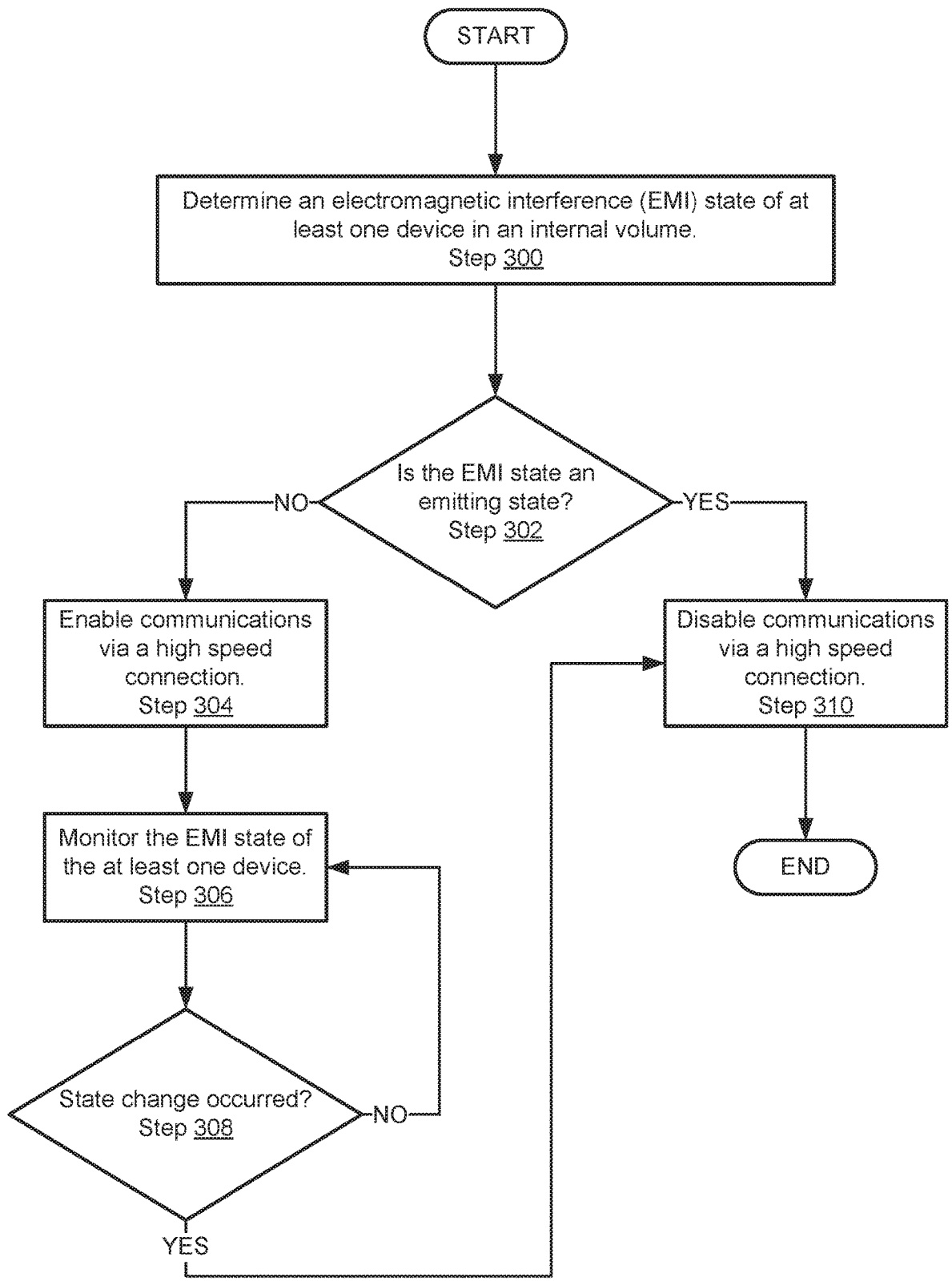
FIG. 3 shows a flowchart of a method of facilitating communications between devices disposed in an electromagnetic interference suppressed internal volume in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices. The data processing device may isolate the electromagnetic interference emitting devices from the ambient environment proximate to the data processing device by at least 90 decibels (or another desirable level of electromagnetic interference suppression). The isolation may be over a first frequency range that corresponds to frequencies on which the electromagnetic interference emitting devices are likely to radiate electromagnetic radiation. For example, the internal volume may have a band stop frequency response tuned to a frequency band on which the electromagnetic interference emitting devices are likely to radiate electromagnetic radiation.

In one or more embodiments of the invention, the data processing device includes a communication system that facilitates communications between devices disposed within the internal volume (e.g., electromagnetic interference emitting devices) and devices disposed outside of the internal volume. The communication system may selectively utilize different types of connections to provide communication services while electromagnetic interference is emitted by devices disposed in the internal volume. Different type of connections may utilize electromagnetic energy in different frequency bands to support the respective connections. By appropriately utilizing different types of connections that utilize different frequency bands, the likelihood of electromagnetic interference propagating outside of the internal volume via a transmission path utilized by the different connections may be reduced.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment (or other portions of the data processing devices (102)) around the data processing devices (102) and/or other locations by at least 90 decibels (or another suitable level of reduction). For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

In addition to limiting propagating of electromagnetic interference, one or more embodiments of the invention may provide methods and/or data processing devices for facilitating communications between electromagnetic interference emitting devices and remote entities while preventing propagation of electromagnetic interference. By doing so, electromagnetic interference emitting devices may be utilized in a computing environment (and/or in other environments) without negatively impacting the computing environment and interacting with the computing environment and/or other entities.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 5.

A chassis may be a mechanical device that is adapted to (i) facilitate attachment of the data processing device to the frame, (ii) house the one or more computing devices, (iii) house one or more electromagnetic interference emitting devices, and/or (iv') provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example; portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal regions may be formed in a manner that filters (e.g., reflects/attenuates radiation of a certain frequency while allowing radiation of other frequencies to propagate) electromagnetic radiation when electromagnetic radiation passes through and/or is incident on the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels or another suitable level) when propagating from within the data processing devices (102) into the ambient environment surrounding the respective data processing devices (102).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels or another suitable level) when propagating from within the data processing devices (102) into the ambient environment surrounding the respective data processing devices (102).

To provide thermal management services to the computing devices and/or the electromagnetic interference emitting devices, the data processing devices (102) may facilitate the flow of gas proximate to the computing devices and/or electromagnetic interference emitting devices. By doing so, the thermal state (i.e., temperature) of the aforementioned devices may be regulated. The gas may be air or another type/combination of gasses obtained from any source.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices and/or other types of devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.6.

As discussed above, data processing devices (102) may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (1102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any, number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density, computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

To open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.6 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). In addition to electromagnetic interference management services, the second data processing device (106) may provide power management services and communications services. The aforementioned services may be provided to electromagnetic interference emitting devices and/or computing devices and/or other types of devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200).

In one or more embodiments of the invention, the front vent (200) reflects and/or attenuates electromagnetic radiation that is propagating from the internal volume (214) to an ambient environment through the front vent (200) by at least 90 decibels (or another suitable level such as, for example, 30 decibels, 45 decibels, 60 decibels, 75 decibels, etc.). By doing so, the front vent (200) may delineate one of the walls of the internal volume (214) to enable the internal volume (214) to be electromagnetically suppressed and/or isolated by 90 decibels (or another suitable level of suppression/isolation) from the ambient environment and/or other portions of the chassis (e.g., the support module (208)).

In one or more embodiments of the invention, the front vent (200) is a rectangular structure formed with holes (202) that enable gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable quantity (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The payload module (210) may be a physical device for (i) housing electromagnetic interference emitting devices (and/or devices that provide services to the electromagnetic interference emitting devices), (ii) limiting propagation of electromagnetic interference from internal volumes of the second data processing device (106) to the ambient environment surrounding the second data processing device (106), and/or (iii) thermally, regulating devices disposed within the payload module (210). For additional details regarding the payload module (210), refer to FIG. 2.2.

The support module (208) may be a physical device for housing devices that provide services to devices disposed within the payload module (210). For example, the support module (208) may house one or more power supplies (e.g., a power system), fans (e.g., a thermal management system), networking devices (e.g., part of a communication system), and/or computing devices. The aforementioned devices may provide corresponding services to devices disposed in other portions of the second data processing device (106) and/or devices located in other locations (i.e., external to the second data processing device (106).

In one or more embodiments of the invention, the support module (208) does not provide electromagnetic interference management services to devices disposed within the support module (208), in contrast to the payload module (210). For example; the support module (208) may not intentionally isolate electromagnetic interference generated by devices disposed within the support module (208) from the ambient environment surrounding the second data processing device (106), intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation.

In one or more embodiments of the invention, providing electromagnetic interference management services reduces the strength of electromagnetic radiation by at least 20 decibels when the electromagnetic radiation propagates from an internal volume of a data processing device to an ambient environment outside of the data processing device. The amount of attenuation may be different from 20 decibels without departing from the invention.

The one or more power supplies may supply power to other devices. For example, the power supplies may provide power to electromagnetic interference emitting devices disposed within the payload module (210), other types of devices (e.g., computing device) disposed within the payload module, and/or devices located in other areas.

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208).

The one or more power networking devices may provide communication services to other devices (e.g., providing network services). For example, the networking devices may manage network interfaces that enables the second data processing device (106) to communicate with other devices (e.g., computing devices that may be control ling the operation of the electromagnetic interference emitting devices).

In one or more embodiments of the invention, the networking devices may cooperatively operate with a communication system disposed within the payload module (210) to provide communication services for devices disposed within the internal volume of the payload module (210). As discussed above, the internal volume of the payload module (210) may electromagnetically isolate devices within the internal volume from devices disposed outside of the internal volume. The communication system disposed within the payload module may facilitate communication between devices disposed within the internal volume of the payload module and devices (e.g., remote entities; devices disposed in the support module (208), etc.) disposed outside of the payload module (210) while maintaining the electromagnetic isolation of the devices disposed within the payload module (210). For additional details regarding the communication system, refer to FIGS. 2.2-2.6.

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module; on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 3. For additional details regarding computing devices, refer to FIG. 5.

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices. Additionally, the internal volume (214) may house a communication system (220), discussed in greater detail below.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth size, by the front vent (200) and the rear vent (204). The front vent (200) and the rear vent (204) may be on opposite sides of the internal volume (214). By doing so, the front vent (200) and the rear vent (204) may define an gas flow path through the payload module (210). For example, gasses may be able to flow from between the two vents through the internal volume (214). For additional discussion of gas flow paths, refer to FIG. 2.5.

As discussed above, second data processing device may allow devices disposed within the internal volume (214) to communicate with devices disposed outside of the internal volume (214) while maintaining the electromagnetic isolation of the devices disposed within the internal volume. To do so, a communication system (220) may be disposed within the internal volume (214).

The communication system (220) may provide communication services between devices within the internal volume (214) and devices outside of the internal volume (214) while maintaining the electromagnetic isolation of the internal volume. To provide the above noted functionality, the communication system (220) may utilize different types of connections between the communication system (220) and devices disposed outside of the internal volume (214) based on the electromagnetic interference emitting state of devices disposed within the internal volume.

A first connection of the different connections may be a high-speed connection. For example, the first connection may utilize physical cabling capable of supporting high-speed communications, connectors capable of supporting high-speed communication, and/or other types of components to support high-speed communications. However, such components may be susceptible to transmission of electromagnetic interference.

For example, the aforementioned cabling, connectors, and/or other types of components may support operational frequencies that correspond to frequencies upon which electromagnetic interference emitting devices (or other types of devices) disposed within the internal volume (214) are likely to emit electromagnetic radiation (e.g., the cabling/connectors may support propagation of electromagnetic radiation at a frequency 900 MHz which may correspond to electromagnetic radiation emitted by electromagnetic interference emitting devices).

Because these high-speed components are likely to be susceptible to transmission of electromagnetic interference similar to that emitted by devices that may be disposed in the internal volume (214), the use of such components may compromise the ability of the internal volume to suppress electromagnetic interference if the high-speed connection is utilized when electromagnetic interference is present.

In one or more embodiments of the invention, the communication system (220) is adapted to disable communications sent via the high-speed connection when devices disposed within the internal volume (214) are emitting electromagnetic interference. For example, the communication system (220) may monitor the electromagnetic interference emitting state of the devices and disable/enable use of the high-speed connection accordingly.

A second connection of the different connections may be a low-speed connection. For example, the second connection may utilize physical cabling capable of supporting low-speed communications, connectors capable of supporting low-speed communications, and/or other types of components to support low-speed communications. The connectors utilized by the low-speed connections may include electromagnetic interference filtering functionality.

For example, the connectors may include electromagnetic radiation filters that prevent electromagnetic interference from propagating through the connectors. The filters may be low pass filters, band pass filters, or band stop filters. By including such filtering functionality, the second connection may not be susceptible to the transmission of electromagnetic interference. Consequently, the low-speed connection may be continuously used, regardless of the electromagnetic interference emitting state of devices disposed within the internal volume, without comprising the electromagnetic interference suppression functionality of the internal volume (214).

In one or more embodiments of the invention, the communication system (220) is a physical device. The physical device may include, for example, one or more transceivers, network data unit processors, and/or other types of components for providing communication services. The aforementioned components may provide the communication services. The communication services may include, for example, exchanging network data units with electromagnetic interference emitting devices disposed in the payload module, a computing device (226) disposed in the support module (208), and/or other devices disposed inside and/or outside of the second data processing device. By doing so, the aforementioned devices may communicate with one another via information included in the exchanged network data units. A network data unit may be a communication supported by a communication protocol that enables information to be transmitted. A network data unit may be, for example, a packet in the event that an internee protocol is utilized. As will be discussed in greater detail below, the communication system (220) may provide the communication services using a bus (230).

The transceivers may be physical devices that generate signals onto which data is encoded. For example, the transceivers may include modulators, power amplifiers, and digital signal processors to generate an electrical signal upon which data has been encoded. The transceivers may be any type of transceiver without departing from the invention.

The signals generated by the transceivers may be used to send network data units to other devices. For example, the signals may be sent along connections to devices disposed within the internal volume (214) and/or devices disposed outside of the internal volume (214). The signals may be sent using any combination of wired and/or wireless networks.

To provide the above noted functionality, the communication system (220) may perform all, or a part, of the methods illustrated in FIG. 3. For example, all, or a portion, of the communication system (220) may be implemented as one or more hardware devices that include circuitry. The circuitry may be adapted to implement the method illustrated in FIG. 3 and/or perform the above noted functionality of the communication system.

In another example, all, or a portion, of the communication system (220) may be implemented using computer instructions, e.g., computer code, stored on a non-transitory medium that when executed by a processor(s) of the communications system (220) causes the processor(s) to perform all, or a part, of the functionality of the communication system (220) and/or perform all, or a portion, of the methods illustrated in FIG. 3. When performing all, or a portion, of the functionality of the communication system (220), the processor may invoke the functionality of one or more other hardware devices transceivers, network data unit processors, modulators, etc.) of the communication system (220).

The computing device (226) may manage the operation of the components of the second data processing device. For example, the computing device (226) may manage the communication system (220), and/or other components (such as electromagnetic interference emitting devices) disposed within the second data processing device. To manage the other devices, the computing device (226) may use the communication services provided by the communication system (220).

For additional details regarding the communication system (220), refer to FIGS. 2.3-2.6.

To further clarify the operation of the second data processing device, FIG. 2.3 shows a second cross section diagram in accordance with one or more embodiments of the invention, that is similar to that of FIG. 2.2, but including connectors (e.g., 222, 224). As discussed above, the communication system (220) may support multiple connections between devices disposed within the internal volume and devices disposed outside of the internal volume (214). By doing so, the communication system (220) may selectively, utilize the connections to maintain the electromagnetic interference suppression state of the internal volume (214). In other words, the communication system (220) may proactively disable connections to prevent electromagnetic interference from propagating outside of the internal volume (214) without being significantly attenuated (e.g., by 90 decibels).

In one or more embodiments of the invention, the second data processing device includes a high-speed connector (222) and a low-speed connector (224) for use by the communication system (220) and/or other components. The second data processing device may include any number of high-speed and/or low-speed connectors without departing from the invention.

The high-speed connector (222) may be utilized by a high-speed connection supported by the communication system (220) and the low-speed connector (224) may be utilized by a low-speed connection supported by the communication system. Both of the aforementioned connections may support communications between entities disposed within the internal volume and entities disposed outside of the internal volume. For example, the communication system (220) may operate as a router, switch, or other type of networking device.

The high-speed connector (222) may be a physical device that enables electromagnetic interference to propagate into and out of the internal volume (214). For example, the high-speed connector (222) may be a bulk head connector that traversed through one of the walls (e.g., the bottom 218) of the internal volume. The high-speed connector (222) may support high speed communications such as those supported by universal serial bus (USB) communications (e.g., communications that utilize electromagnetic energy having a frequency content reaching 100 MHz or greater).

The high-speed connector (222) may support propagation of electromagnetic radiation up to a high frequency. The high frequency may be greater than all, or a portion, the frequency range in which devices disposed within the internal volume are likely to emit electromagnetic radiation. Consequently, the high-speed connector (222) may support propagation of electromagnetic interference from inside the internal volume (214) to outside the internal volume (214) without being subject to the attenuation that would be caused had the electromagnetic interference propagated though other portions of the walls (e.g., bottom, sides, top, front vent, rear vent) of the internal volume.

The low-speed connector (224) may be a physical device that enables electromagnetic interference to propagate into and out of the internal volume (214). For example, the low-speed connector (224) may be a bulk head connector that traversed through one of the walls (e.g., the bottom 218) of the internal volume. The low-speed connector (224) may support low-speed communications such as those supported by recommended standard 232 (RS-232) communications (e.g., communications that utilize electromagnetic energy having a frequency content below that utilized by high-speed communications such as, for example, less than 10 megahertz).

The low-speed connector (224) may support propagation of electromagnetic radiation up to a low frequency. The low frequency may be less than the frequency range in which devices disposed within the internal volume are likely to emit electromagnetic radiation. Consequently, the low frequency connector (224) may not support propagation of electromagnetic interference from inside the internal volume (214) to outside of the internal volume (214).

For example, the low-speed connector (224) may include a filter that severely, attenuates electromagnetic radiation that is likely to be emitted by devices disposed within the internal volume (214). The filter may be, for example, a low pass filter, a band reject filter, or a band pass filter. The filter may be implemented using any suitable technology (e.g., waveguide filter, surface acoustical wave filters, circuit filters, microwave filters, circuit card filters, etc.).

While not illustrated in FIG. 2.3, the high-speed connector (222) and the low-speed connector (224) may be connected to other devices. For example, the aforementioned connectors may be operably connected to networking devices, computing devices, or any other type of device. By doing so, signals may be sent between the communication system (220) and the other devices via different connections (e.g., high-speed connection, low-speed connection) that utilize the respective connectors.

While the connectors (222, 224) are illustrated in FIG. 2.3 as being disposed on the bottom (218) of the internal volume (214), the connectors (222, 224) may be disposed at other locations without departing from the invention. For an example illustrating the connectors being disposed at a different location, refer to FIG. 2.4. For additional details regarding the connections supported by the communication system (220), refer to FIGS. 2.5-2.6.

To further clarify the operation of the second data processing device, FIG. 2.4 shows a third cross section diagram in accordance with one or more embodiments of the invention, that is similar to that of FIG. 2.2, but including connectors (e.g., 222, 224) disposed near a rear vent (204). As discussed above, the connectors (222, 224) may be disposed on other walls of the internal volume (214) without departing from the invention.

For example, as illustrated in FIG. 2.4, the high-speed connector (222) and the low-speed connector (224) may be disposed on a wall between the internal volume (214) and the support module (208). In this configuration, the connectors (222, 224) may facilitate propagation of electromagnetic radiation between the internal volume (214) and the support module (208). In contrast, the configuration illustrated in FIG. 2.3 facilitated propagation of electromagnetic radiation between the internal volume (214) and ambient environment surrounding the second data processing device.

In the configuration illustrated in FIG. 2.4, the communication system (220) may be operably connected to devices disposed within the support module (208) and/or devices disposed outside of the support module (208). For example, a networking device may be disposed within the support module (208). The network device may support communications with remote entities (e.g., devices disposed outside of the second data processing device), The communication system (220) may be operably connected to the networking device via a high-speed connection and a low-speed connection that uses the respective high-speed connector (222) and the low-speed connector (224).

To further clarify the operation of the second data processing device, FIG. 2.5 shows a fourth cross section diagram in accordance with one or more embodiments of the invention, that is similar to that of FIG. 2.2, but including connectors (e.g., 222, 224) disposed near a rear vent (204) and wired connections (227). As discussed above, the connectors (222, 224) may be disposed on other walls of the internal volume (214) without departing from the invention.

In one or more embodiments of the invention, the communication system (220) may be disposed within the internal volume (214) at a location separate from the connectors. In such a scenario, wired connections (227) may be used to operably connect the communication system (220) to the connectors (222, 224). Similarly, wired connections (227) outside of the internal volume (214) may be used to operably connect other devices (e.g., network devices, computing devices, other types of devices) to the connectors (222, 224), and in turn, the communication system (220).

In one or more embodiments of the invention, the wired connections guide electromagnetic radiation upon which data has been encoded from the communication system (220) to the connectors (222, 224) and, in turn, other devices (and the reverse). By doing so, the communication system (220) may be disposed away from the connectors within the internal volume.

In one or more embodiments of the invention, the wired connections (227) are shielded. For example, the wired connections (227) may include a Faraday shield or other type of electromagnetic isolation technology. The aforementioned shielding may reduce the likelihood of electromagnetic interference propagating outside of the internal volume (214) through the connectors (222, 224).

To further clarify the operation of the second data processing device, FIG. 2.6 shows a fifth cross section diagram in accordance with one or more embodiments of the invention, that is similar to that of FIG. 2.5, but including electromagnetic interference emitting devices (250) and a connection set (221), As discussed above, the communication system (220) may support communications between devices disposed within the internal volume (214) and devices outside of the internal volume (214).

For example, in one or more embodiments of the invention, electromagnetic interference emitting devices (250) may be disposed in the internal volume (214). In such a scenario, the electromagnetic interference emitting devices (250) may periodically generate electromagnetic radiation within the internal volume (214) while also attempting to communicate with devices disposed outside of the internal volume (214), Similarly, the electromagnetic interference emitting devices (250) may need to communicate with devices disposed outside of the internal volume (214) while none of the electromagnetic interference emitting devices (250) are emitting electromagnetic radiation.

Depending upon the electromagnetic interference emitting state of the electromagnetic interference emitting devices (250) and/or other devices disposed within the internal volume (214), the communication system (220) may selectively use different connections of a connection set (221) to facilitate communications between the devices disposed within the internal volume (214) and devices disposed outside of the internal volume (214).

In one or more embodiments of the invention, the communication system (220) is adapted to disable a high-speed connection of the connection set (221) while any devices disposed within the internal volume (214) are generating electromagnetic radiation within the internal volume (214). While electromagnetic radiation is being generated within the internal volume (214) the communication system (220) may exclusively use low-speed connections of the connection set (221). By doing so, the communication system (220) may reduce the likelihood of allowing electromagnetic interference to propagate outside of the internal volume (214) via a high-speed connector utilized by the high-speed connection of the connection set (221).

For example, when the communication system (221)) exclusively utilizes low-speed connections of the connection set (221), the communication system (220) may ground or otherwise electromagnetically terminate the cabling leading to and from high-speed connectors operably connected to the communication system (220). By doing so, the communication system (220) may reduce the ability of electromagnetic interference to propagate outside of the internal volume (214) via high-speed connectors.

In contrast, the communication system (220) may not take any action with respect to the cabling and/or low-speed connectors. As discussed above, low-speed connectors may include filtering functionality that automatically reflects and/or attenuates electromagnetic interference that is likely to be generated by the electromagnetic interference emitting devices (250) and/or other devices likely to be disposed within the internal volume (214).

To provide the aforementioned functionality of the communication system (220), the communication system (220) may be operably connected to the electromagnetic interference emitting devices (250) and/or other devices disposed within the internal volume (214). The operable connections may be supported by any combination of wired and/or wireless connections. For example, a bus (230) may be disposed within the internal volume (214). The bus (230) may be a physical device for facilitating the transmission of information between devices disposed within the internal volume (214).

For example, electromagnetic interference emitting devices (250) may be operably connected to the communication system (220) via the bus (230). Alternatively, electromagnetic interference emitting devices (250) may be operably connected to the communication system (220) via wireless connections (not shown). The wireless connections may be, for example, wireless local area network connections, point-to-point wireless connections, or any other type of wireless connection that facilitates communications between the communication system (220) and electromagnetic interference emitting devices (250).

The connection set (221) may include any number of operable connections between the connectors (225) and/or other entities. For example, the connection set (221) may include a high-speed connection and a low-speed connection. The connection set (221) may include any number of operable connections supporting any number of different connection speeds (e.g., bandwidths).

While not illustrated in FIG. 2.6, the communication system (220) may be operably connected to a networking device disposed within the support module (208). The networking device may be operably connected to any number of devices disposed outside of the second data processing device via the connection set (221).

While data processing devices illustrated in FIGS. 1.1-2.6 have been illustrated as including a limited number of specific components, the data processing device in accordance with one or more embodiments of the invention include additional, fewer, and/or different components without departing from the invention.

As discussed above, a communication system in accordance with embodiments of the invention may selectively utilize different types of connections (e.g., high-speed, low-speed) to provide communication services while maintaining electromagnetic interference suppression functionality of data processing devices. FIG. 3 shows a method that may be performed by a communication system when providing communication services.

FIG. 3 shows a flowchart of a method in accordance with one or more embodiments of the invention. The method depicted in FIG. 3 may be used to provide communication services in accordance with one or more embodiments of the invention. The method shown in FIG. 3 may be performed completely, or in part, by, for example, data processing devices (e.g., 102, FIG. 1.1). Other components of the system illustrated in FIG. 1.1 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, an electromagnetic interference state of at least one device disposed within an internal volume of the data processing device is determined.

In one or more embodiments of the invention, electromagnetic interference state of the device is whether the device is generating electromagnetic interference. Electromagnetic interference may be, for example, electromagnetic radiation. The electromagnetic radiation may be radiated by the devices for any purpose without departing from the invention. The electromagnetic radiation may be radiated by the devices intentionally or unintentionally.

In one or more embodiments of the invention, the electromagnetic interference state is determined by requesting the state from the at least one device. For example, a message requesting the state may be sent to device and the device may appropriately respond to the request by indicating the electromagnetic interference state.

In one or more embodiments of the invention, the electromagnetic interference state is determined by monitoring whether the at least one device is generating electromagnetic interference. For example, a sensor may be used to monitor whether electromagnetic interference is being generated within the internal volume of the data processing device. In another example, other types of hardware devices, other than sensors specifically adapted to monitor electromagnetic interference, may be used to monitor whether electromagnetic interference has been generated within the internal volume. For example, a communication system may utilize its transceivers to measure whether electromagnetic interference has been generated within the internal volume.

In step 302, it is determined whether electromagnetic interference state is an emitting state. An emitting state may be a state in which electromagnetic radiation is radiated into the internal volume. The determination may be made based on the state determination made in step 300. If the electromagnetic interference state is in an emitting state, the method may proceed to step 310. If the electromagnetic interference state is not in an emitting state, the method may proceed to step 304.

In step 304, communications are enabled via a high-speed connection. To enable communications via the high-speed connection, a communication system may start (or continue sending if communication is already enabled via the high-speed connection) sending network data units via the high-speed connection. For example, the communication system may begin sending network data units via the high-speed connection.

The high-speed connection may utilize a high-speed connector that is susceptible to propagation of electromagnetic interference. For example, the high-speed connector may not include filtering functionality for electromagnetic interference is likely to be generated by devices disposed within the internal volume of the data processing device.

In step 306, the electromagnetic interference state of the at least one device is monitored. The electromagnetic interference state of the at least one device may be monitored by requesting the status of the state from the at least one device and/or monitoring whether electromagnetic radiation within the internal volume of the data processing device is being generated by the at least one device. Such determinations may be made similarly to that discussed with respect to step 300.

In step 308, it is determined whether the state change has occurred. The state change may be whether the electromagnetic interference state of the at least one device has changed. The determination may be made based on the monitoring of the electromagnetic interference state of the at least one device of step 306.

If a state change has not occurred, the method may proceed to step 306. Thus, during steps 306-308, communications via a high-speed connection may be enabled. However, if a state change has occurred, the method may proceed to step 310.

In step 310, communications via the high-speed connection are disabled. Communications via the high-speed connection may be disabled by a communication system so that the communication system no longer sends network data units via the high-speed connection.

As part of disabling indications via the high-speed connection, remote entities that were utilizing the high-speed connection may be notified of the high-speed connection being disabled. The notifications may be sent via a low-speed connection which is still operable after disabling the high-speed connection. By doing so, the remote entities may efficiently redirect network data units to reverse the low-speed connection rather than the high-speed connection.

Thus, after step 310, the data processing device may only be capable of providing communication services between devices disposed within an internal volume and devices disposed outside of the internal volume via low-speed connections that have inherent electromagnetic interference suppressing functionality.

The method may end following step 310.

Returning to step 302, if it is determined that the electromagnetic interference state is in an emitting state, the method may proceed to step 310. If the electromagnetic interference state is in an emitting state, the at least one device may be emitting electromagnetic interference. Consequently, the emitted electromagnetic interference may utilize a high-speed connector for propagating outside of the internal volume if the high-speed connection is in use while the electromagnetic interference is emitted into the internal volume.

As discussed above, in step 310 communications via the high-speed connection are disabled. Consequently, by disabling the high-speed connection the likelihood of electromagnetic interference, being emitted by the at least one device as discussed with respect to step 302, propagating out of the internal volume via a high-speed connector may be reduced. By doing so, the electromagnetic interference suppression functionality of the internal volume may be maintained while still enabling communications between devices disposed in the internal volume and devices disposed outside of the internal volume.

As discussed above, method may end following step 310.

Thus, via the method illustrated in FIG. 3, electromagnetic interference emitting devices (and/or other types of devices) may communicate with devices outside of an electromagnetic interference suppressed volume without compromising the integrity of the electromagnetic interference suppressed volume.

To further clarify aspects of embodiments of the invention, a nonlimiting example is provided in FIGS. 4.1-4.2. FIG. 4.1 shows a diagram of an example system and FIG. 4.2 shows a diagram of actions that may be performed by the example system of FIG. 4.1. The system of FIG. 4.1 may be similar to that of FIG. 1.1. For the sake of brevity, only a limited number of components of the system of FIG. 1.1 are illustrated in FIG. 4.1.

Example

Consider a scenario as illustrated in FIG. 4.1 which shows a diagram of an example system. The example system includes a data processing device (400) that is being used as part of a high-density computing environment. Other portions of the high-density computing environment are not illustrated in FIG. 4.1 for brevity.

A first electromagnetic interference emitting device (402) and a second electromagnetic interference emitting device (404) are disposed within an internal volume of the data processing device (400) that electromagnetically isolates the electromagnetic interference emitting devices from other devices disposed within the high-density computing environment. Additionally, the communication system (406) is disposed within the internal volume of the data processing device (400). The communication system (406) may have similar functionality as discussed with respect to FIGS. 2.3-2.6.

The communication system (406) may be operably connected to the electromagnetic interference emitting devices (402, 404) and/or to other devices disposed outside of the data processing device (400) via a connection set (408). The connection set (408) may include a high-speed connection and low-speed connection, as discussed with respect to FIGS. 2.4-2.6.

The connection set (408) may operably connect the communication system (406) to a network (410). In turn, the network (410) may operably connect to a test manager (412) and a remote data storage (414).

The test manager (412) may be a physical device tasked with testing the functionality of the electromagnetic interference emitting devices (402, 404). To do so, the test manager (412) may include functionality to send and receive information to the electromagnetic interference emitting devices via the communication system (406).

The remote data storage (414) may be a physical device that stores data. The remote data storage (414) may include functionality to provide data to the electromagnetic interference emitting devices (402, 404) via the communication system (406).

At a first point in time, a number of actions may be performed by components of the example system of FIG. 4.1. FIG. 4.2 shows a diagram of the actions performed by the components of the example system of FIG. 4.1. As seen from FIG. 4.2, at the first point in time the first electromagnetic interference emitting device (402) sends a data request (420) to the communication system (406). The data request (420) may be addressed to the remote data storage (414).

Upon receiving the data request (420), the communication system (406) makes a determination that either of the first nor the second electromagnetic interference emitting devices are emitting electromagnetic interference at this time. In response to the determination, the communication system (406) forwards the data request via a high-speed connection (422) to the remote data storage (414).

In response to receiving the forwarded data request, the remote data storage (414) identifies data requested by the data request (420) and sends the data via the high-speed connection (424) to the communication system (406).

However, prior to the data being received by the communication system (406), the test manager (412) initiates a test (426) by sending a request addressed to the second electromagnetic interference emitting device (404) to the communication system (406). In response to receiving the request to initiate the test, the communication system (406) forwards the test initiation (428) to the second electromagnetic interference emitting device (404). The test initiation (428) requests that the second electromagnetic interference emitting device (404) begins emitting electromagnetic radiation which is considered to be electromagnetic interference in this context.

In response to receiving the forwarded test initiation (428), the second electromagnetic interference emitting device (404) initiates electromagnetic interference emission (430) by radiating electromagnetic radiation within the internal volume of the data processing device.

The communication system (406) identifies that the second electromagnetic interference emitting device (404) has started emitting electromagnetic radiation and, in response to the determination, disables the high-speed connection (432). By disabling the high-speed connection (432), the communication system (406) has reduced the likelihood of electromagnetic interference propagating outside of the internal volume via a high-speed connector used by the high-speed connection. After the high-speed connection (432) is disabled, the remote data storage (414) identifies that the high-speed connection has been disabled and sends an additional copy of the data via a low-speed connection (434) to the communication system (406).

In response to receiving the copy of the data via the low-speed connection (434) the communication system (406) provides the data (436) to the first electromagnetic interference emitting device (402). By doing so, the first electromagnetic interference emitting device (402) is able to continue to communicate with devices disposed outside of the internal volume while the second electromagnetic interference emitting device (404) emits electromagnetic interference within the internal volume.

End of Example

Figure 5:
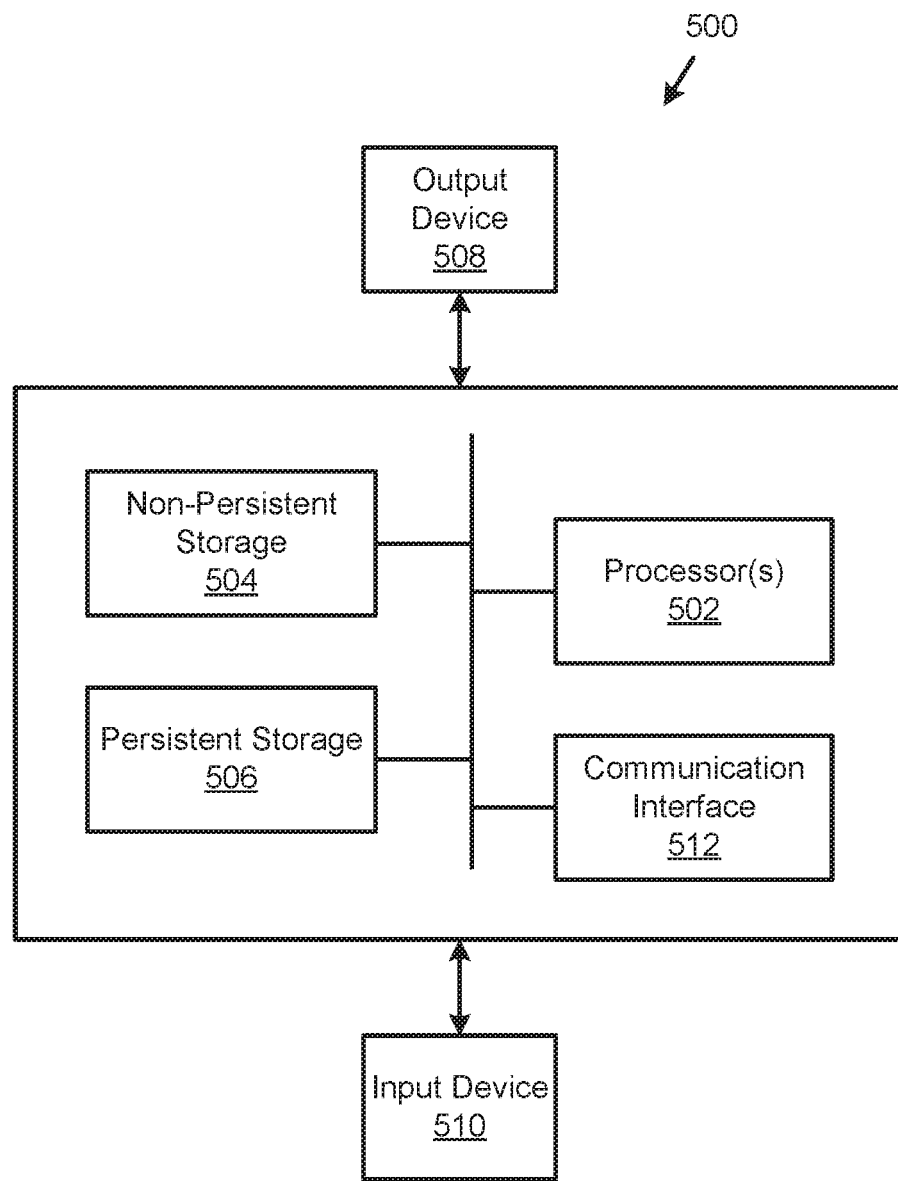
FIG. 5 shows a diagram of a computing device in accordance with one or more embodiments of the invention.

As discussed above, embodiments of the invention may be implemented using computing devices. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), input devices (510), output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display, device), a printer, external storage, or any other output device. One or more of the output devices may be the same or different from the input device(s). The input and output device(s) may be locally or remotely connected to the computer processor(s) (502), non-persistent storage (504), and persistent storage (506), Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such data processing devices may include functionality to limit the propagation of electromagnetic interference from within data processing devices to an ambient environment surrounding the data processing device. By doing so, such data processing devices may be used in a high-density environment without negatively impacting the functionality of the high-density environment.

A data processing device in accordance with embodiments of the invention may provide communication services to devices disposed within the data processing device. To do so, the data processing device may include a communication system that utilizes multiple types of connections for providing communication services. By doing so, the data processing devices may provide communication services by selectively utilizing different type of connections while reducing the likelihood of electromagnetic interference propagating outside of the data processing devices and, consequently, impacting the functionality of other devices proximate to the data processing devices.

Thus, embodiments of the invention may address the problem of electromagnetic interference within a high-density environment. Specifically, embodiments of the invention may provide a data processing device level solution that facilitates granular control of electromagnetic interference in the aforementioned environments while still allowing the electromagnetic interference generating devices to communicate with remote entities.

The problems discussed above should be understood as being examples of problems solved by embodiments of the invention disclosed herein and the invention should not be limited to solving the same/similar problems. The disclosed invention is broadly, applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
an internal volume that is electromagnetic interference (EMI) isolated; and
a communication system, disposed in the internal volume, adapted to:
determine a first EMI state of at least one device of devices disposed in the internal volume;
make a determination that the first EMI state is an EMI emitting state; and
disable communications by the communication system using a high-speed connection while allowing the communications using a low-speed connection.

2. The data processing device of claim 1, wherein the low-speed connection utilizes a low-speed connector to exit the internal volume.

3. The data processing device of claim 2, wherein the low-speed connector comprises an EMI filter adapted to filter EMI generated by the at least one of the devices.

4. The data processing device of claim 3, wherein the EMI filter is a low pass filter.

5. The data processing device of claim 3, wherein the EMI generated by the at least one of the devices comprises a carrier signal for wireless communications.

6. The data processing device of claim 1, wherein the high-speed connection utilizes a high-speed connector to exit the internal volume.

7. The data processing device of claim 6, wherein the high-speed connector does not include an EMI filter adapted to filter EMI generated by the at least one of the devices.

8. The data processing device of claim 1, wherein the internal volume is EMI isolated by at least 90 decibels.

9. The data processing device of claim 1, wherein the internal volume is bounded by four conducting walls and two EMI suppressing vents tuned to a frequency band corresponding to a carrier signal for wireless communications utilized by the at least one of the devices.

10. The data processing device of claim 1, wherein the communication system is further adapted to:
determine a second EMI state of the at least one of the devices;
make a second determination that the second EMI state is not an EMI emitting state; and
enable, based on the second determination, second communications by the communication system using the high-speed connection and the low-speed connection.

11. The data processing device of claim 10, wherein the communication system is further adapted to:
while the second communications using the high-speed connection are enabled:
monitor a third EMI state of the at least one of the devices;

make a third determination that the third EMI state has changed from the second EMI state based on the monitoring; and disable, based on the third determination, the second communications using the high-speed connection.

12. The data processing device of claim 1, wherein the communication system is operably, connected to a high-speed connector utilized by the high speed connection and a low-speed connector utilized by the low speed connection by wired connections.

13. The data processing device of claim 12, wherein the wired connections are shielded from EMI associated with the at least one of the devices.

14. The data processing device of claim 1, wherein the at least device is an EMI emitting device.

15. A method for managing electromagnetic interference (EMI), comprising:
determine a first EMI state of at least one device of devices disposed in an internal volume of a data processing device, wherein the internal volume is adapted to suppress EMI generated by the at least one device of the devices;
make a determination that the first EMI state is an EMI emitting state; and
disable communications with remote entities by a communication system disposed in the internal volume using a high-speed connection while allowing the communications using a low-speed connection.

16. The method of claim 15, further comprising:
determine a second EMI state of the at least one of the devices;
make a second determination that the second EMI state is not an EMI emitting state; and
enable, based on the second determination, second communications by the communication system using the high-speed connection and the low-speed connection.

17. The method of claim 16, further comprising:
while the second communications using the high-speed connection are enabled:
monitor a third EMI state of the at least one of the devices;
make a third determination that the third EMI state has changed from the second EMI state based on the monitoring; and
disable, based on the third determination, the second communications using the high-speed connection.

18. A non-transitory computer readable medium comprising instructions that when executed by a data processing device cause the data processing device to perform a method for managing electromagnetic interference (EMI), the method comprising:
determine a first EMI state of at least one device of devices disposed in an internal volume of a data processing device, wherein the internal volume is adapted to suppress EMI generated by the at least one device of the devices;
make a determination that the first EMI state is an EMI emitting state; and
disable communications with remote entities by a communication system disposed in the internal volume using a high-speed connection while allowing the communications using a low-speed connection.

19. The non-transitory computer readable medium of claim 18, wherein the method further comprises:
determine a second EMI state of the at least one of the devices;
make a second determination that the second EMI state is not an EMI emitting state; and
enable, based on the second determination, second communications by the communication system using the high-speed connection and the low-speed connection.

20. The non-transitory computer readable medium of claim 19, wherein the method further comprises:
while the second communications using the high-speed connection are enabled:
monitor a third EMI state of the at least one of the devices;
make a third determination that the third EMI state has changed from the second EMI state based on the monitoring; and
disable, based on the third determination, the second communications using the high-speed connection.

* * * * *